United States Patent
Chen et al.

(10) Patent No.: US 9,125,489 B2
(45) Date of Patent: Sep. 8, 2015

(54) FIXING DEVICE FOR A SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 93 days.

(21) Appl. No.: 13/914,855

(22) Filed: Jun. 11, 2013

(65) Prior Publication Data

US 2014/0363109 A1 Dec. 11, 2014

(51) Int. Cl.
*A47B 88/04* (2006.01)
*A47B 88/00* (2006.01)
*H05K 7/14* (2006.01)

(52) U.S. Cl.
CPC .............. *A47B 88/044* (2013.01); *A47B 88/00* (2013.01); *H05K 7/1489* (2013.01)

(58) Field of Classification Search
CPC ........ A47F 7/00; A47B 88/00; A47B 88/044; A47B 88/0418; A47B 88/042
USPC ............ 248/27.1, 298.1, 316.8, 250, 220.21, 248/220.31, 220.41, 265.2, 265.3; 312/334.7, 333, 334.8, 334.46, 334.44, 312/330.1, 223.1, 265.1, 265.4, 319.1, 312/334.1, 334.4, 334.5; 108/143
See application file for complete search history.

(56) References Cited

U.S. PATENT DOCUMENTS

| | | | |
|---|---|---|---|
| 3,054,511 A * | 9/1962 | Erismann ...................... 211/208 |
| 6,749,275 B2 * | 6/2004 | Cutler et al. ............... 312/334.4 |
| 6,871,920 B2 * | 3/2005 | Greenwald et al. ........ 312/334.4 |
| 6,926,378 B2 * | 8/2005 | Greenwald et al. ........ 312/334.4 |
| 6,929,339 B1 * | 8/2005 | Greenwald et al. ........ 312/334.4 |
| 6,957,878 B2 | 10/2005 | Greenwald et al. |
| 6,968,606 B2 * | 11/2005 | Fromm et al. .................. 29/434 |
| 7,641,297 B2 * | 1/2010 | Huang ....................... 312/334.4 |
| 7,699,279 B2 * | 4/2010 | Chen et al. ............... 248/220.41 |
| 7,703,734 B2 * | 4/2010 | Chen et al. ................. 248/298.1 |
| 7,731,142 B2 * | 6/2010 | Chen et al. .................... 248/244 |
| 7,857,145 B2 * | 12/2010 | Mushan et al. ................. 211/26 |
| 7,878,468 B2 * | 2/2011 | Chen et al. ............... 248/220.41 |
| 8,104,626 B2 * | 1/2012 | Huang et al. .................... 211/26 |
| 8,602,225 B2 * | 12/2013 | Lin et al. ......................... 211/26 |
| 8,727,138 B2 * | 5/2014 | Dittus et al. .................... 211/26 |
| 8,807,351 B2 * | 8/2014 | Lin et al. ......................... 211/26 |
| 2010/0200523 A1 * | 8/2010 | Henderson ....................... 211/26 |
| 2012/0018605 A1 * | 1/2012 | Lacarra ...................... 248/224.8 |
| 2012/0292274 A1 * | 11/2012 | Lin et al. ..................... 211/86.01 |
| 2013/0056432 A1 * | 3/2013 | Lin et al. ....................... 211/123 |

* cited by examiner

*Primary Examiner* — Nkeisha Smith
(74) *Attorney, Agent, or Firm* — Rosenberg, Klein & Lee

(57) ABSTRACT

A fixing device of a slide assembly has a bracket. The fixing device includes an insertion member, an engaging member and a resilient member. The insertion member is connected to the bracket and has a slot. The engaging member is slidably connected relative to the bracket and has an operation portion and an arm which extends through the slot of the insertion member. The arm has a first protrusion. The resilient member provides a force to the engaging member to extend the first protrusion beyond the slot of the insertion member. By moving the operation portion, the first protrusion is controlled to be retracted toward the slot of the insertion member.

17 Claims, 13 Drawing Sheets

FIXING DEVICE FOR A SLIDE ASSEMBLY

FIELD OF THE INVENTION

The present invention relates to a slide assembly, and more particularly, to a fixing device for a slide assembly so as to securely connect the slide assembly to a rack.

BACKGROUND OF THE INVENTION

U.S. Pat. Nos. 6,929,339 and 6,957,878 to Greenwald et al. and US Patent Publication Nos. 2012/0292274 and 2013/0056432 to Lin et al. respectively disclose a fixing device for a slide assembly and these fixing devices are referenced when preparing the specification of the present invention.

Each of the conventional fixing devices disclosed in the above-mentioned cases generally comprises an arm having a hook, a spring providing a force to the arm, and an installation member with a slot. The arm is inserted into the slot of the installation member and the hook of the arm protrudes from the slot by the force provided by the spring. The arm directly extends through the installation member so that when the installation member is to be connected to the positioning hole of the column of a rack, the hook exposed from the slot of the installation member affects the installation of the installation member to the rack. Besides, the slot in the installation member reduces the structural strength of the installation member and hence affects the stability of for installing the installation member to the rack.

The present invention intends to provide a fixing device for a slide assembly, and the fixing device handily and securely connects the slide assembly to a rack.

SUMMARY OF THE INVENTION

The present invention relates to fixing device of a slide assembly, and the slide assembly comprises a support member and a bracket connected to the support member. The bracket has a side wall and an end wall. The side wall has a window. The end wall is substantially perpendicularly connected to the side wall. At least one installation member connected to the end wall of the bracket. An insertion member is connected to the end wall of the bracket and has a slot defined therein. An engaging member is slidably connected relative to the bracket and has an operation portion and an arm. The operation portion is located corresponding to the window of the side wall of the bracket. The arm extends through the slot of the insertion member and has a first protrusion. A resilient member provides a force to the engaging member to extend the first protrusion beyond the slot of the insertion member.

Furthermore, the present invention provides a fixing device being connected to a bracket and the fixing device comprises at least one installation member connected to the bracket. An insertion member is connected to the bracket and has a slot. An engaging member is slidably connected relative to the bracket and has an arm which extends through the slot of the insertion member. The arm has a first protrusion. A resilient member provides a force to the engaging member to extend the first protrusion beyond the slot of the insertion member.

Preferably, the bracket has a side wall and an end wall. The end wall is substantially perpendicularly connected to the side wall. The engaging member has an operation portion which is located corresponding to the side wall of the bracket.

Preferably, the end wall has a through hole. The insertion member has a body and a head connected with the body. The insertion member extends through the through hole.

Preferably, the body of the insertion member has a recessed area and a first locking portion which is located in the recessed area and adjacent to the head.

Preferably, the end wall has two installation holes, a fixing member and two installation members which are connected to the fixing member. The fixing member is fixed to the bracket, and the installation members extend through the installation holes of the end wall of the bracket respectively.

Preferably, each installation member has a movable rectangular portion, a cylindrical portion and a spring. The rectangular portion is slidably connected relative to the cylindrical portion. The spring applies a force to the rectangular portion so that the rectangular portion extends beyond the fixing member and located at a pre-set position.

Preferably, the side wall has a window and the operation portion of the engaging member slidably contacts/engages with an inside of the window. The engaging member is movable relative to the insertion member to control the first protrusion of the arm to protrude beyond or to retract toward the slot of the insertion member.

Preferably, the side wall of the bracket has a first guide portion and the engaging member has a second guide portion. A guide member is located between the first and second guide portions. Besides, the present invention also provides a slide assembly for being installed to a rack. The rack has multiple columns and each column has multiple holes which comprises a first hole, a second hole and a third hole which is located between the first and second holes. A chassis is connected to the rack by two slide assemblies. The chassis has a locking device. Each slide assembly comprises a first rail, a second rail being slidable relative to the first rail. A bracket is connected to the first rail and has a side wall and an end wall. The side wall has a window, and the end wall is substantially perpendicularly connected to the side wall. The end wall has two installation holes and a through hole. A fixing member is fixed to the bracket. A third rail is slidably connected between the first and second rails. An insertion member is connected to the end wall of the bracket and partially extends through the through hole of the end wall of the bracket. The insertion member has a slot and a locking portion which is located corresponding to the locking device of the chassis. An engaging member is slidably connected relative to the bracket and has an operation portion and an arm. The operation portion is located corresponding to the window of the side wall of the bracket. The arm extends through the slot of the insertion member and has a first protrusion. A resilient member provides a force to the engaging member to extend the first protrusion beyond the slot of the insertion member. Two installation members are connected to the fixing member and extend through the installation holes of the end wall of the bracket respectively. The two installation members are connected to the first and second holes of the column of the rack respectively. The insertion member is inserted into the third hole of the column of the rack. The arm of the engaging member extends through the slot of the insertion member. The first protrusion of the engaging member extends beyond the slot of the insertion member and is connected to the column of the rack by the force of the resilient member applied to the engaging member. When the slide assembly is installed to the rack, the first locking portion of the insertion member is engaged with the locking device of the chassis.

Preferably, the operation portion of the engaging member slidably contacts an inside of the window. The engaging member is movable relative to the insertion member to control the first protrusion of the arm to protrude beyond or to retract toward the slot of the insertion member.

Preferably, the side wall of the bracket has a first guide portion, and the engaging member has a second guide portion. A guide member is located between the first and second guide portions.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
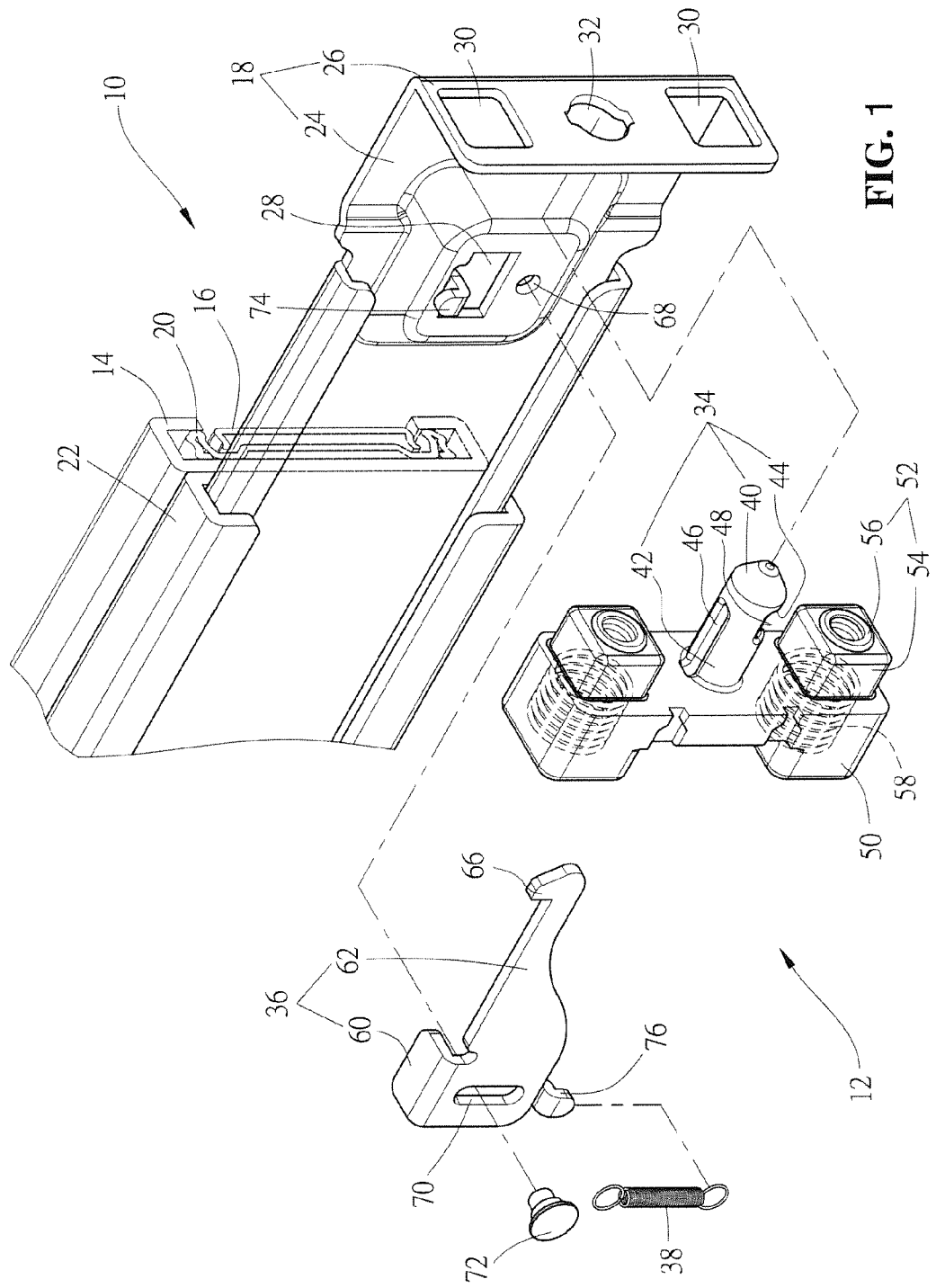
FIG. 1 is an exploded view to show the bracket and the fixing device of the slide assembly.
Figure 1A:
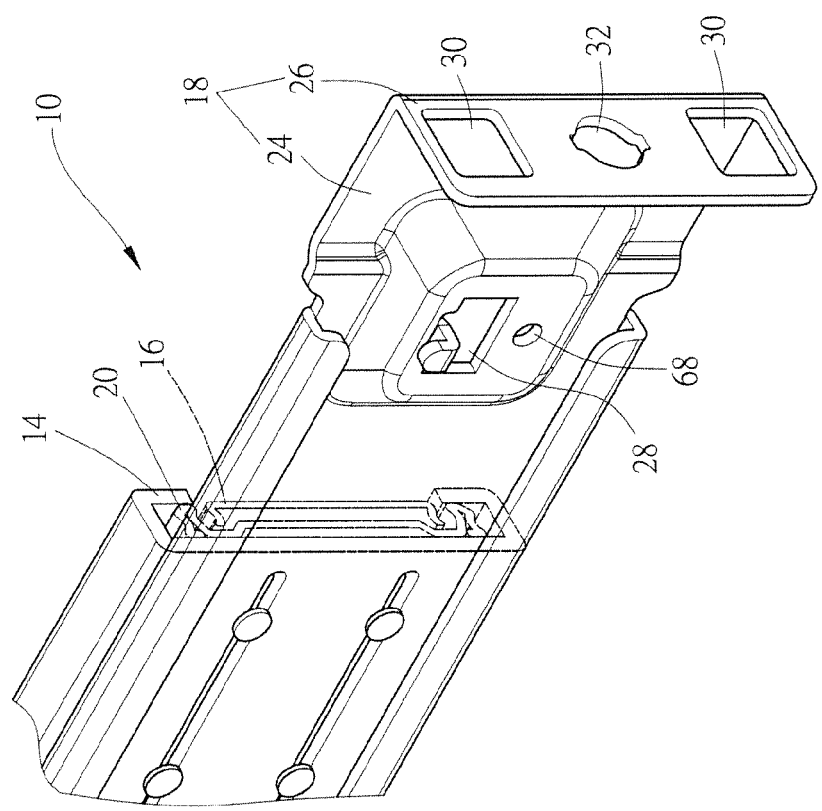
FIG. 1A shows that the bracket is connected with the first rail.

FIG. 1 shows the slide assembly 10 and a fixing device 12 of an embodiment of the present invention. The slide assembly 10 comprises a first rail 14, a second rail 16 slidably connected to the first rail 14, and a bracket 18. Preferably, a third rail 20 is slidably connected between the first and second rails 14, 16, so that the second rail 16 is extendable to a further position relative to the first rail 14 by the third rail 20. In one embodiment, a support member 22 is connected to the first rail 14, and the bracket 18 is connected to the support member 22. The support member 22 is securely fixed to the first rail 14 so that the support member 22 is deemed as a part of the first rail 14. As shown in FIG. 1A, in another embodiment, the bracket 18 is connected to the first rail 14. More specifically, the bracket 18 has a side wall 24 and an end wall 26, and the end wall 26 is substantially perpendicularly connected to the side wall 24. Preferably, the end wall 26 is bent from the front end of the side wall 24. The side wall 24 has a window 28. The end wall 26 has two installation holes 30 and a through hole 32. Preferably, the through hole 32 is located between the two installation holes 30. The fixing device 12 has an insertion member 34, an engaging member 36 and a resilient member 38.

Figure 2:
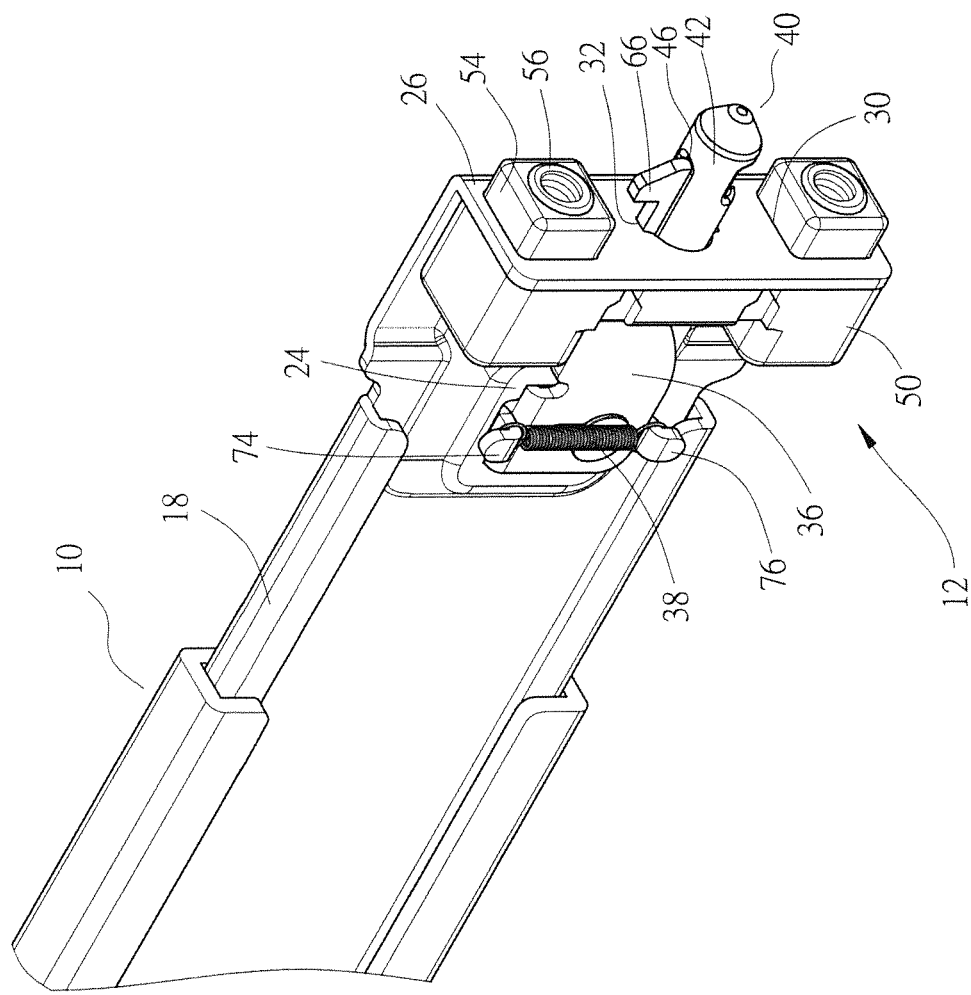
FIG. 2 shows that the fixing device is connected to the bracket of the slide assembly.

FIGS. 1 and 2 show an example of the arrangement of the fixing device 12. The insertion member 34 connected to the end wall 26 of the bracket 18 and has a head 40, a body 42 connected with the head 40, and a first locking portion 44. Preferably, the head 40 extends from one end of the body 42. The body 42 extends through the through hole 32 of the end wall 26 of the bracket 18. The body 42 has a slot 46 defined therein. The first locking portion 44 is connected to the body 42. Preferably, the body 42 of the insertion member 34 has a recessed area 48, and the first locking portion 44 is located in the recessed area 48 and adjacent to the head 40. In one embodiment, the fixing device 12 has a fixing member 50 and two installation members 52 which are connected to the fixing member 50. The fixing member 50 is fixed to the bracket 18. Preferably, the installation members 52 are arranged corresponding to the end wall 26 of the bracket 18. For example, the installation members 52 extend through the installation holes 30 of the end wall 26 of the bracket 18 respectively. In one preferable embodiment, each installation member 52 has a movable rectangular portion 54, a cylindrical portion 56 and a spring 58. The rectangular portion 54 is slidably connected to the cylindrical portion 56. The spring 58 applies a force to the rectangular portion 54 so that the rectangular portion 54 extends beyond the fixing member 50 and located at a pre-set position. The arrangement and functions of the installation member 52 is disclosed in U.S. Pat. No. 7,878,468 own by the applicant, and U.S. Pat. No. 7,878,468 is incorporated in the present invention.

The engaging member 36 has an operation portion 60 and an arm 62. The engaging member is slidable relative to the insertion member 34, wherein the operation portion 60 is located corresponding to the window 28 of the side wall 24 of the bracket 18. In one preferable embodiment, the operation portion 60 is bent from one end of the arm 62. The arm 62 extends through the slot 46 of the insertion member 34 and has a first protrusion 66 which extends through the slot 46 and extends beyond the slot 46. Preferably, the operation portion 60 extends through and beyond the window 28 so that the user can easily press the operation portion 60. Preferably, the operation portion 60 of the engaging member 36 slidably contacts the inside of the window 28 to allow the engaging member 36 to be movable relative to the insertion member 34 to control the first protrusion 66 of the arm 62 to protrude beyond or to retract toward the slot 46 of the insertion member 34. Preferably, the side wall 24 of the bracket 18 has a first guide portion 68, and the engaging member 36 has a second guide portion 70. A guide member 72 is located between the first and second guide portions 68, 70, so that the engaging member 36 is slidable relative to the bracket 18. Preferably, the guide member 72 can be made integrally with one of the first and second guide portions 68, 70. In one example, the first guide portion 68 is a hole, the second guide portion 70 is a guiding slot, and the guide member 72 is a pin which is engaged with the guiding slot and is fixed to the hole to let the engaging member 36 slide relative to the bracket 18 by the relative movement that the pin moves along the guiding slot. In another example, the first guide portion 68 is a guiding slot, the second guide portion 70 is a hole, and the guide member 72 is a pin which is engaged with the guiding slot and is fixed to the hole to let the engaging member 36 slide relative to the bracket 18 by moving the pin along the guiding slot. It is noted that the fixing member 50 is deemed as a portion of the bracket 18 when the fixing member 50 is fixed to the bracket 18. In an alternative embodiment, the first guide portion 68 is installed on the fixing member 50 (not shown) to allow the engaging member 36 to be slidable relative to the bracket 18 by the arrangement of the second guide portion 70 and the guide member 72. In other words, the engaging member 36 is slidably connected relative to one of the fixing member 50 and the bracket 18.

Figure 3:
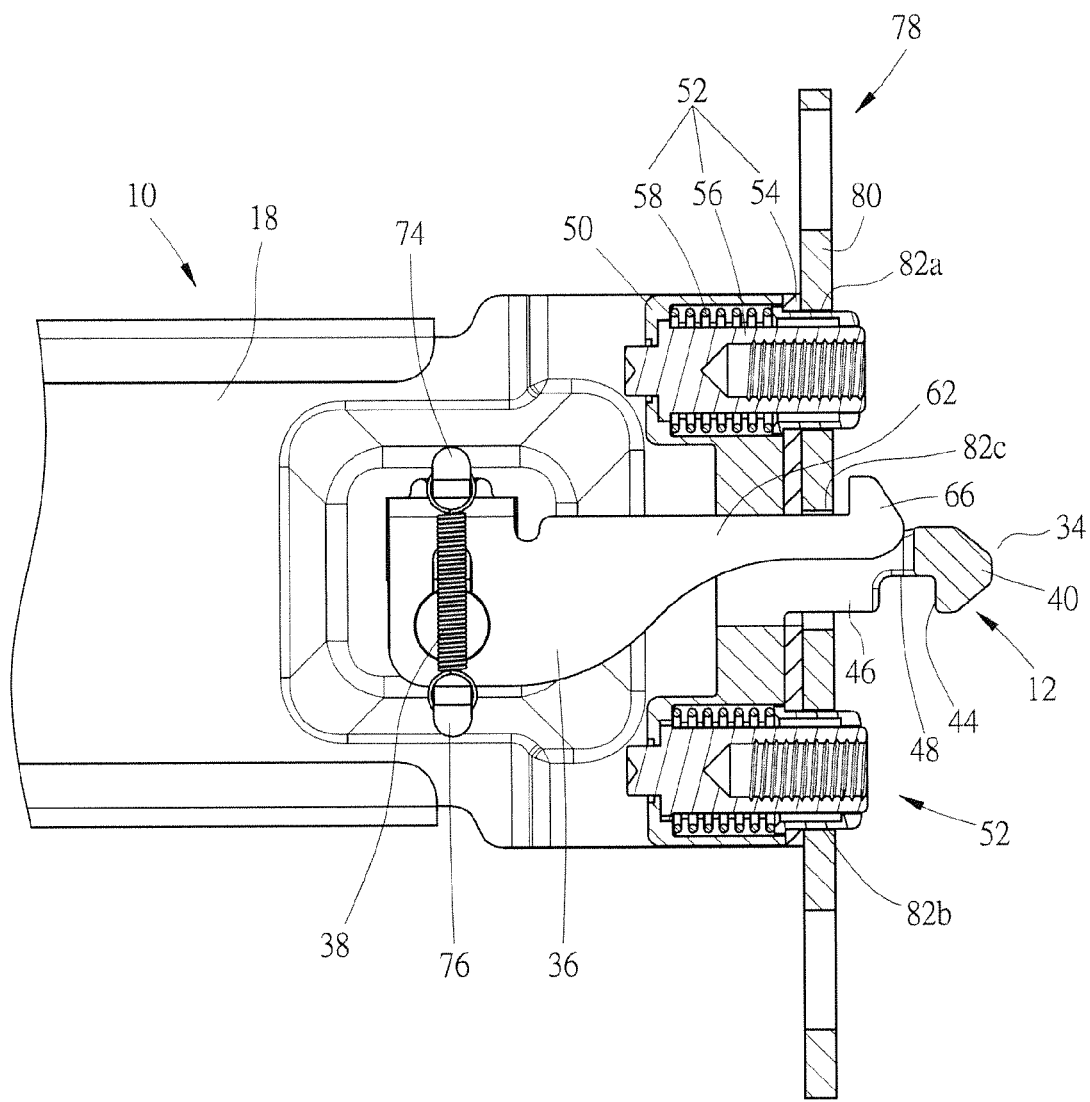
FIG. 3 is a cross sectional view to show that the bracket is connected to the column.

The resilient member 38 is located between the side wall 24 of the bracket 18 and the engaging member 36. More specifically, the side wall 24 has a first connection portion 74, and the engaging member 36 has a second connection portion 76. Two ends of the resilient member 38 are respectively connected to the first and second connection portions 74, 76. Under this arrangement, as shown in FIG. 3, the resilient member 38 provides a force to the engaging member 36 to extend the first protrusion 66 of the engaging member 36 beyond the slot 46 of the insertion member 34. In an alternative embodiment, the first connection portion 74 is fixed to the fixing member 50 (not shown). In other words, the first connection portion 74 is connected to one of the fixing member 50 and the bracket 18.

Figure 4:
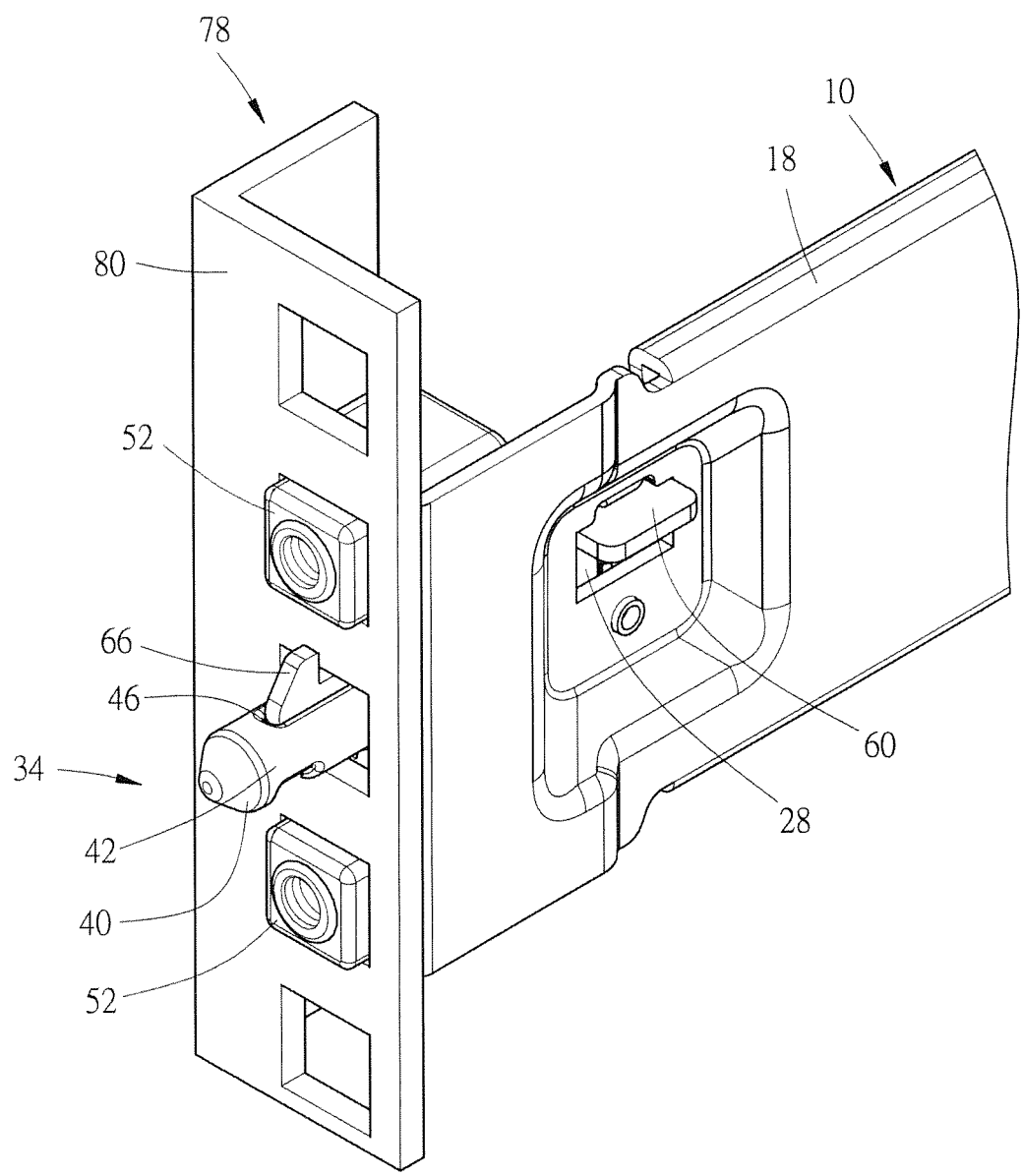
FIG. 4 is a perspective view to show another angle of view of the bracket connected to the column.

FIGS. 3 and 4 show that the slide assembly 10 is installed to a rack 78. The rack 78 at least has a column 80. The column 80 has multiple holes such as a first hole 82a, a second hole 82b and a third hole 82c which is located between the first and second holes 82a, 82b. More specifically, the two installation members 52 of the fixing device 12 are installed through the first and second holes 82a, 82b of the column 80 of the rack 78 respectively. The insertion member 34 is inserted into the third hole 82c of the column 80 of the rack 78. The arm 62 of the engaging member 36 extends through the slot 46 of the insertion member 34. The first protrusion 66 of the engaging member 36 extends beyond the slot 46 of the insertion member 34 and is engaged with the column 80 of the rack 78 by the force of the resilient member 38 applied to the engaging member 36. Under this arrangement, the slide assembly 10 is secured to the column 80 of the rack 78 and does not separate from the column 80 by the installation members 52 installed to the column 94 and by the first protrusion 66 of the engaging member 36 of the fixing device 12 arranged corresponding to the column 80.

In one preferable embodiment, the distance that the insertion member 34 extends beyond the fixing member 50 is longer than the distance that the installation member 52 extends beyond the fixing member 50.

Figure 5:
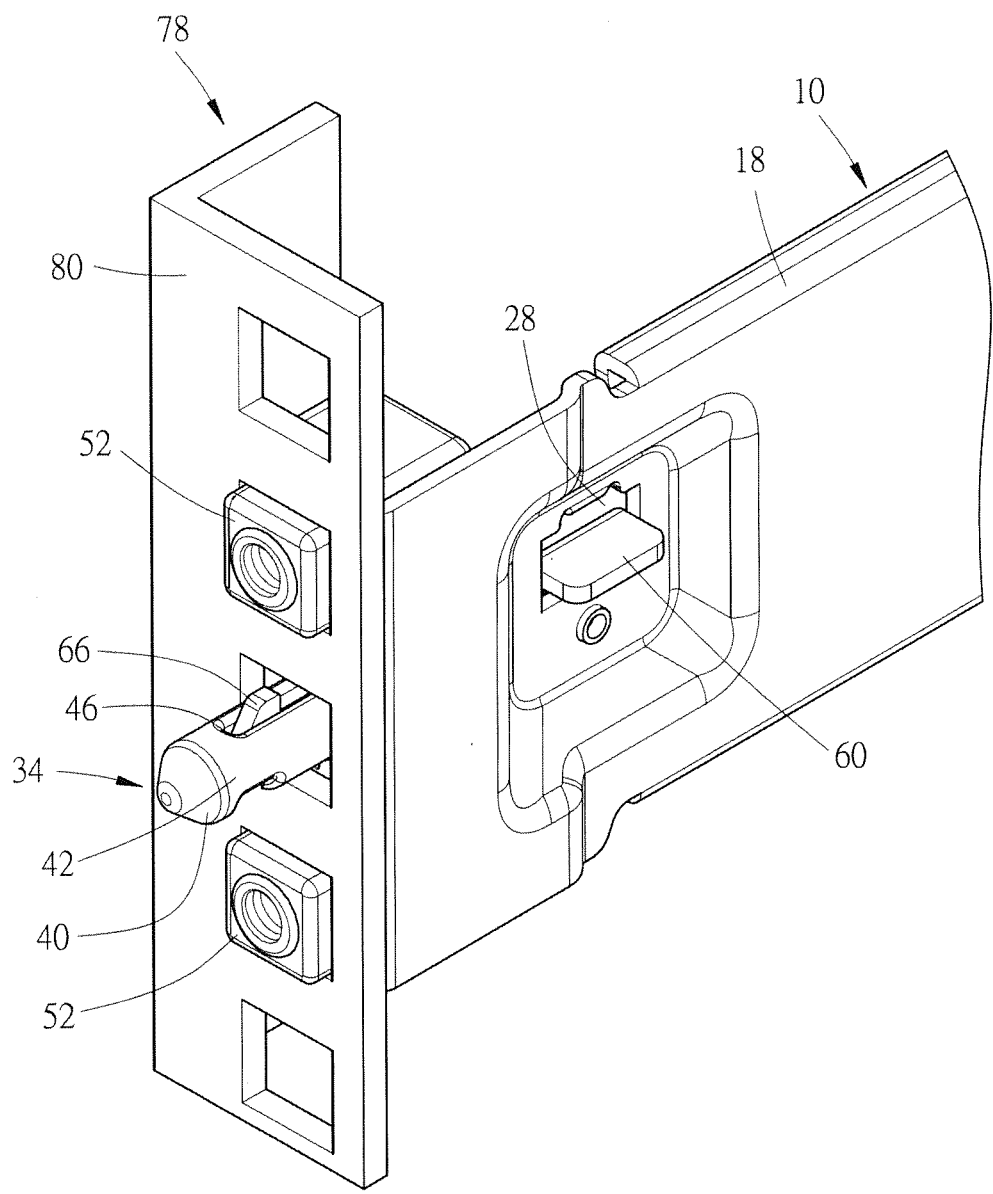
FIG. 5 is a perspective view to show the operation to separate the bracket from the column.
Figure 6:
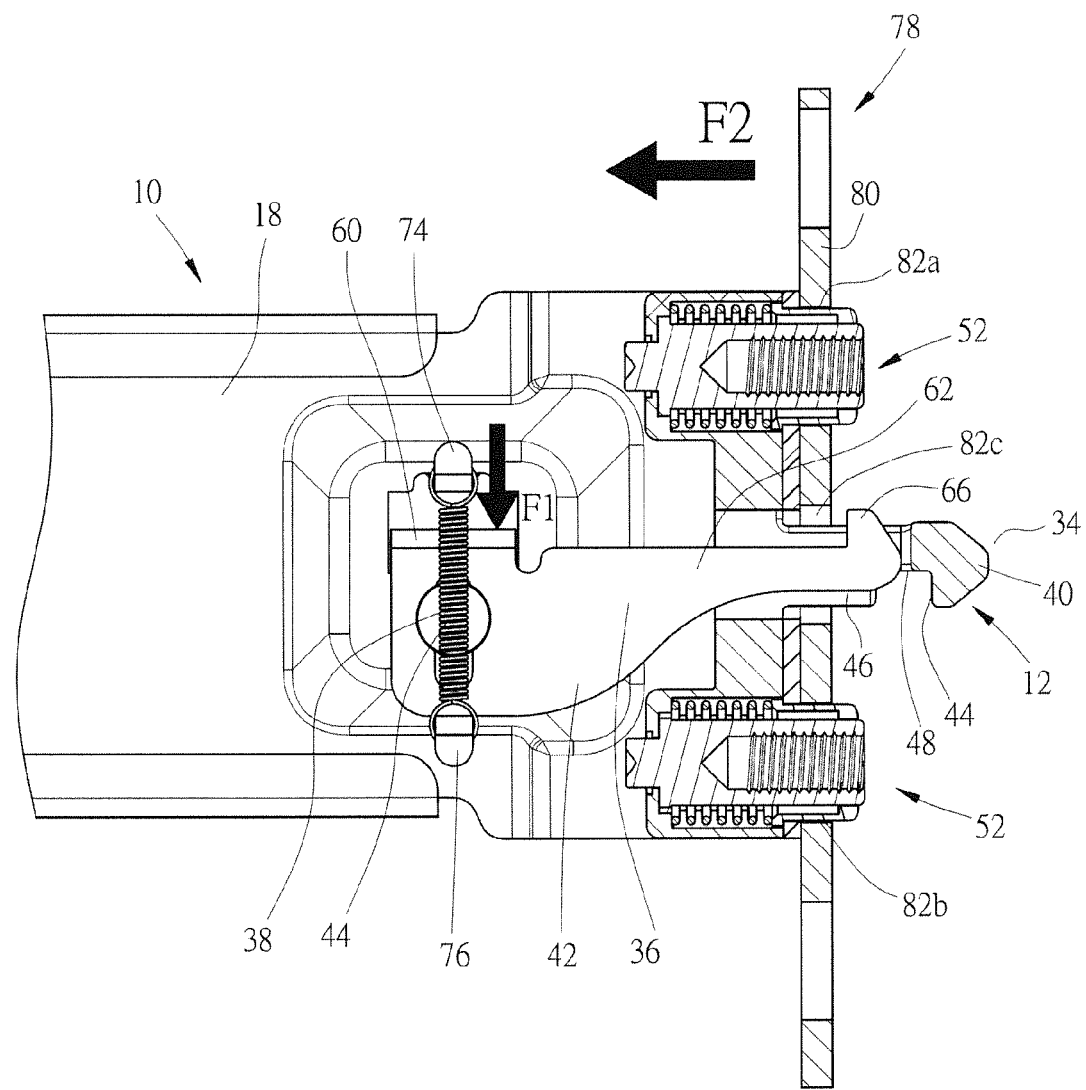
FIG. 6 is a cross sectional view to show that the bracket is to be separated from the column.

FIGS. 5 and 6 show the operation to disassemble the slide assembly 10 from the rack 78, wherein the user applies a force F1 from the window 28 of the bracket 18 to the operation portion 60 of the engaging member 36 to let the engaging member 36 overcome the spring force of the resilient member 38 and move until the first protrusion 66 of the engaging member 36 is retracted toward the slot 46 and does not interfere the column 80 of the rack 78. In this status, the first protrusion 66 of the engaging member 36 is disengaged from the column 80, so that the slide assembly 10 is able to be disassembled from the column 80 of the rack 78 from the direction indicated by F2 in FIG. 6.

Figure 7:
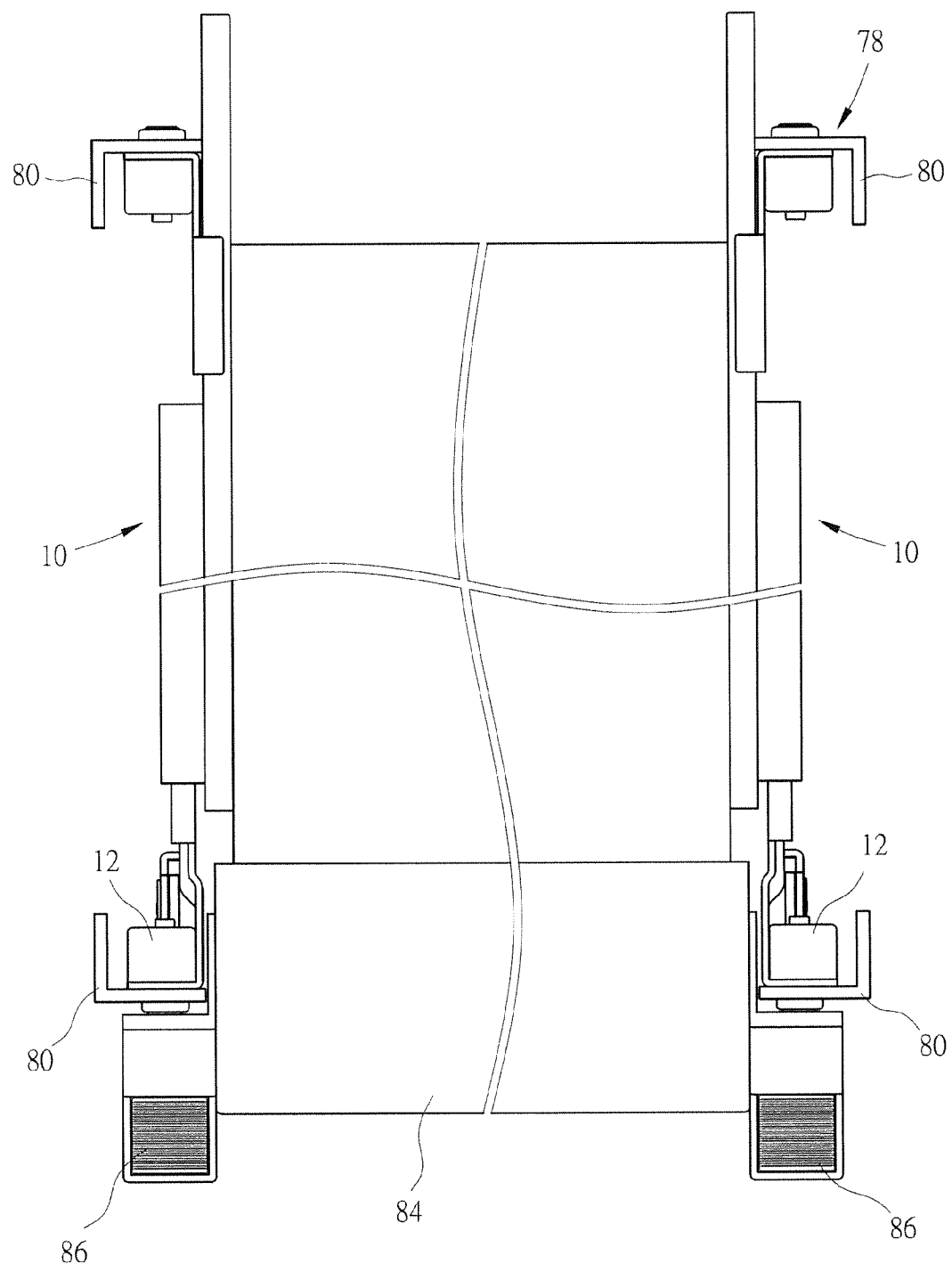
FIG. 7 shows that the chassis is installed to the rack.

FIG. 7 shows that the chassis 84 is installed to the rack 78 by two slide assemblies 10, wherein the rack 78 has four columns 80. In one preferable embodiment, the chassis 84 has at least one locking device 86 located corresponding to the fixing device 12.

Figure 8:
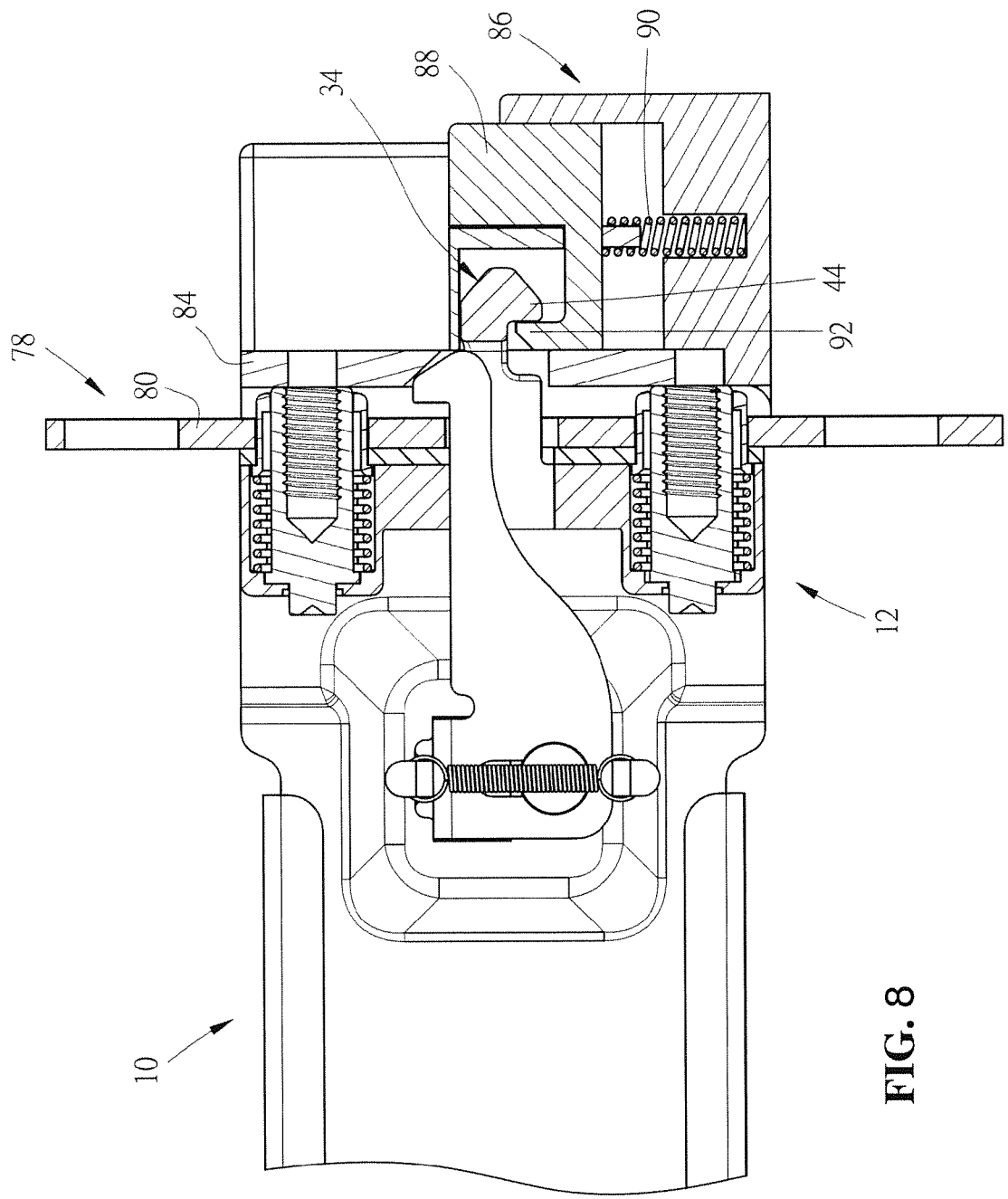
FIG. 8 shows the connection between the fixing device and the chassis.

FIG. 8 shows that the locking device 86 has a locking member 88 and a spring 90, wherein the locking member 88 has a second locking portion 92 located corresponding to the first locking portion 44 of the insertion member 34 of the fixing device 12. The first locking portion 44 of the insertion member 34 and the second locking portion 92 of the locking member 80 are engaged with each other by the spring 90 applying a force to the locking member 88. Therefore, the chassis 84 is firmly connected to the fixing device 12 of the slide assembly 10 by the locking device 86.

Figure 9:
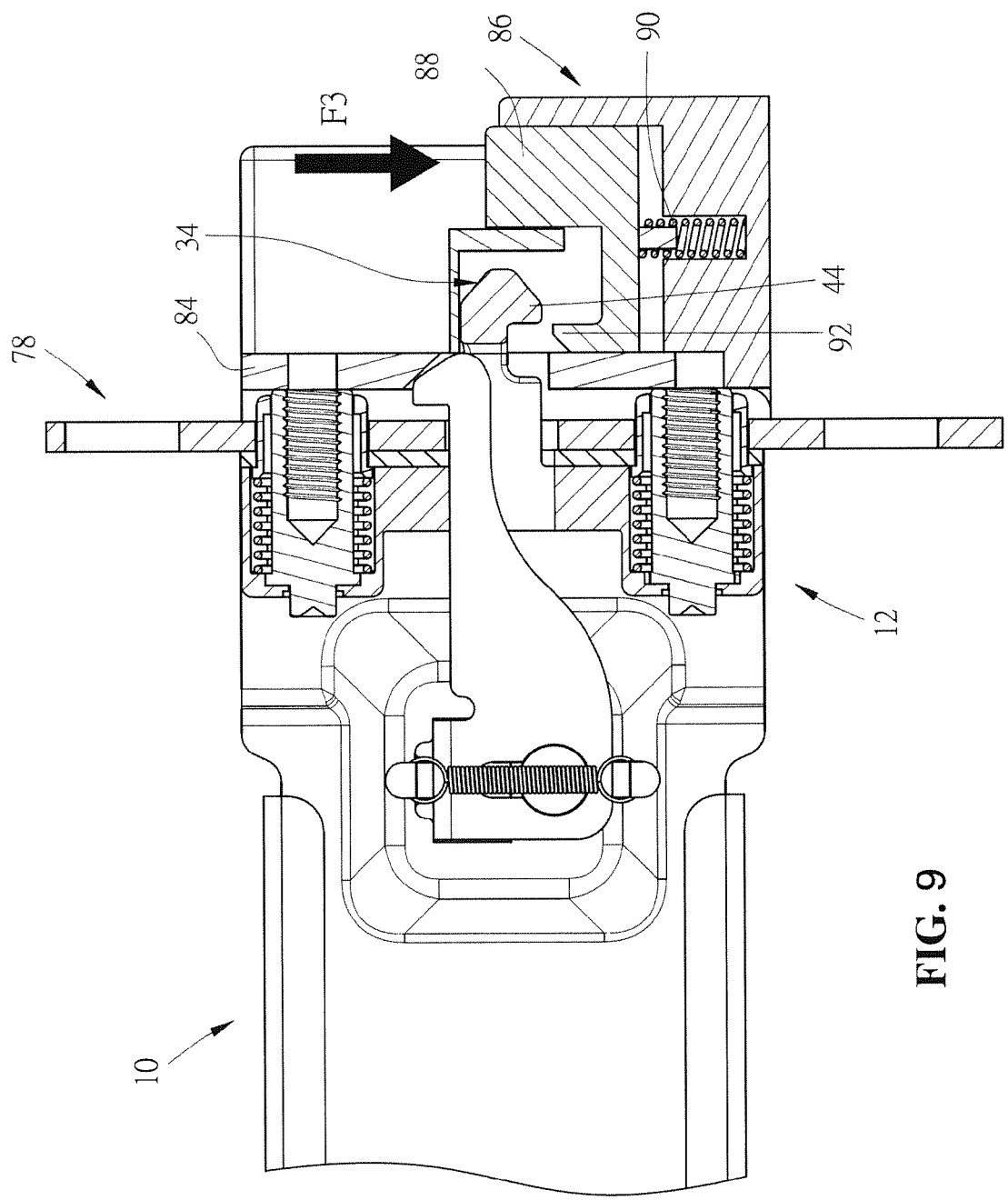
FIG. 9 shows the operation to separate the chassis from the fixing device.

FIG. 9 shows that when a force F3 is applied to the locking member 88 of the locking device 86, the locking member 88 moves and overcomes the spring force of the spring 90 in response to the force F3 to let the second locking portion 92 of the locking member 88 disengage from the first locking portion 44 of the insertion member 34. In this status, the chassis 84 can be easily moved away from the rack 78 by the two slide assemblies 10.

Figure 10:
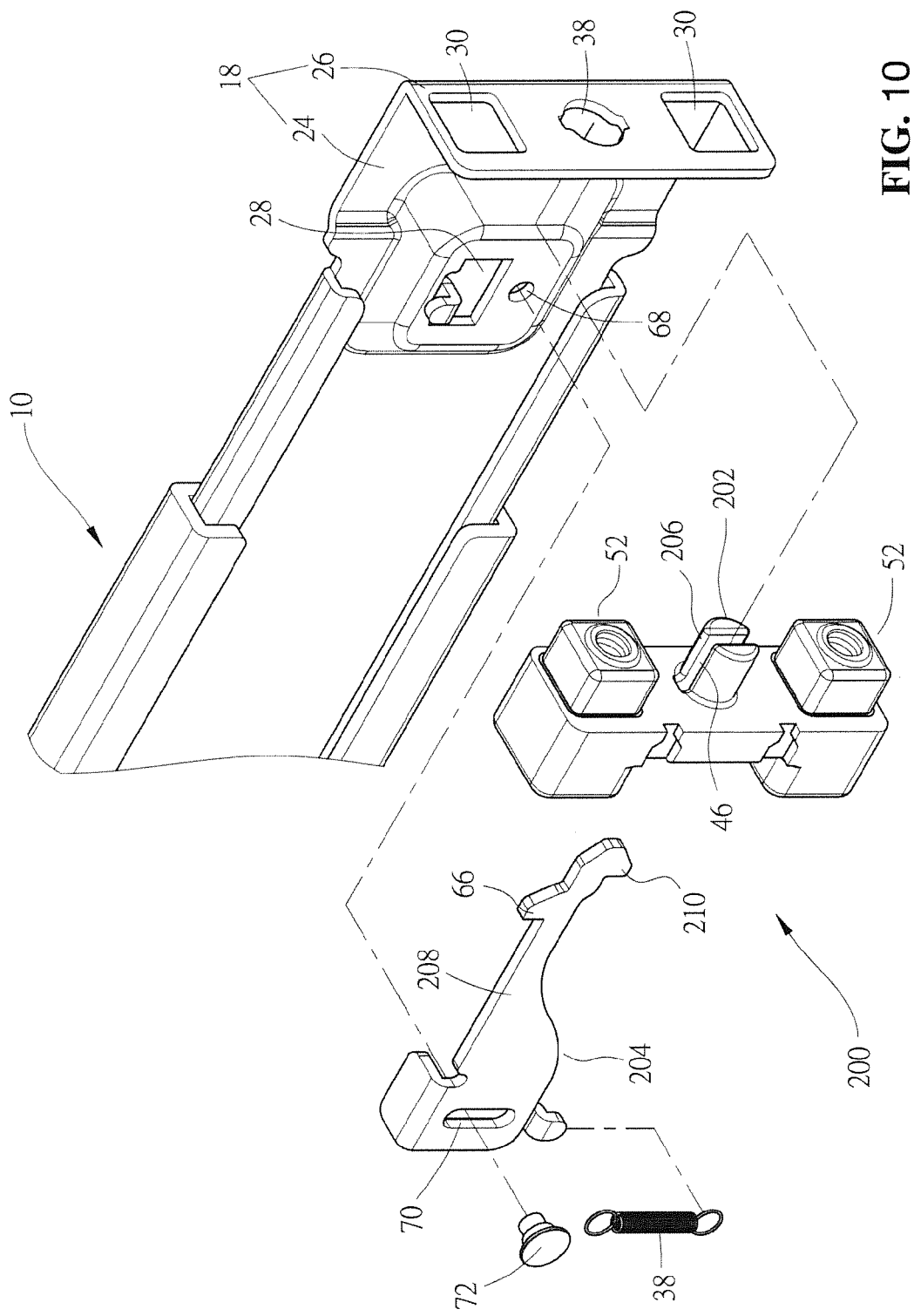
FIG. 10 is an exploded view to show the fixing device and the bracket of the other embodiment of the slide assembly.
Figure 11:
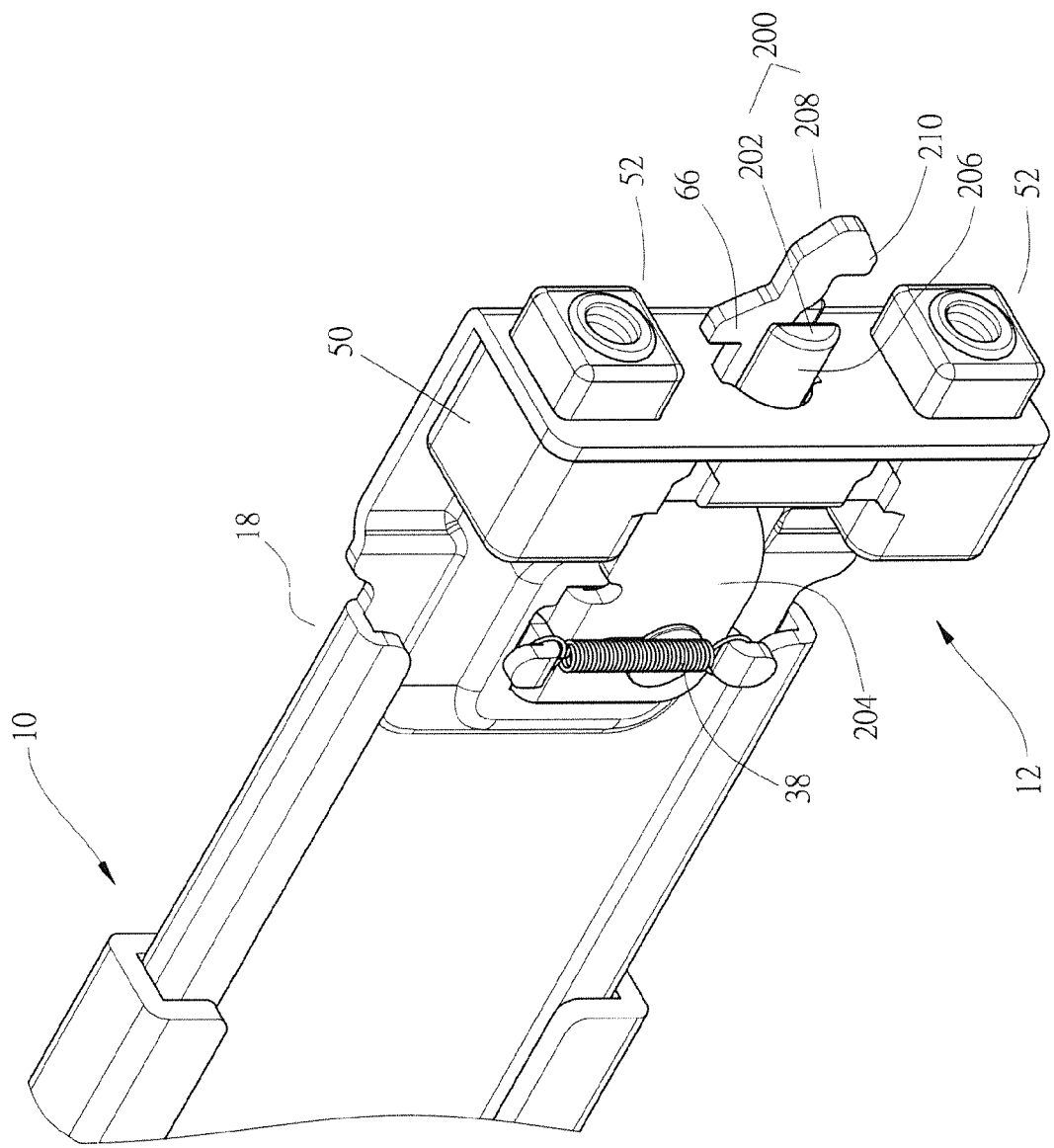
FIG. 11 shows that the fixing device is fixed to the bracket of the embodiment in FIG. 10.
Figure 12:
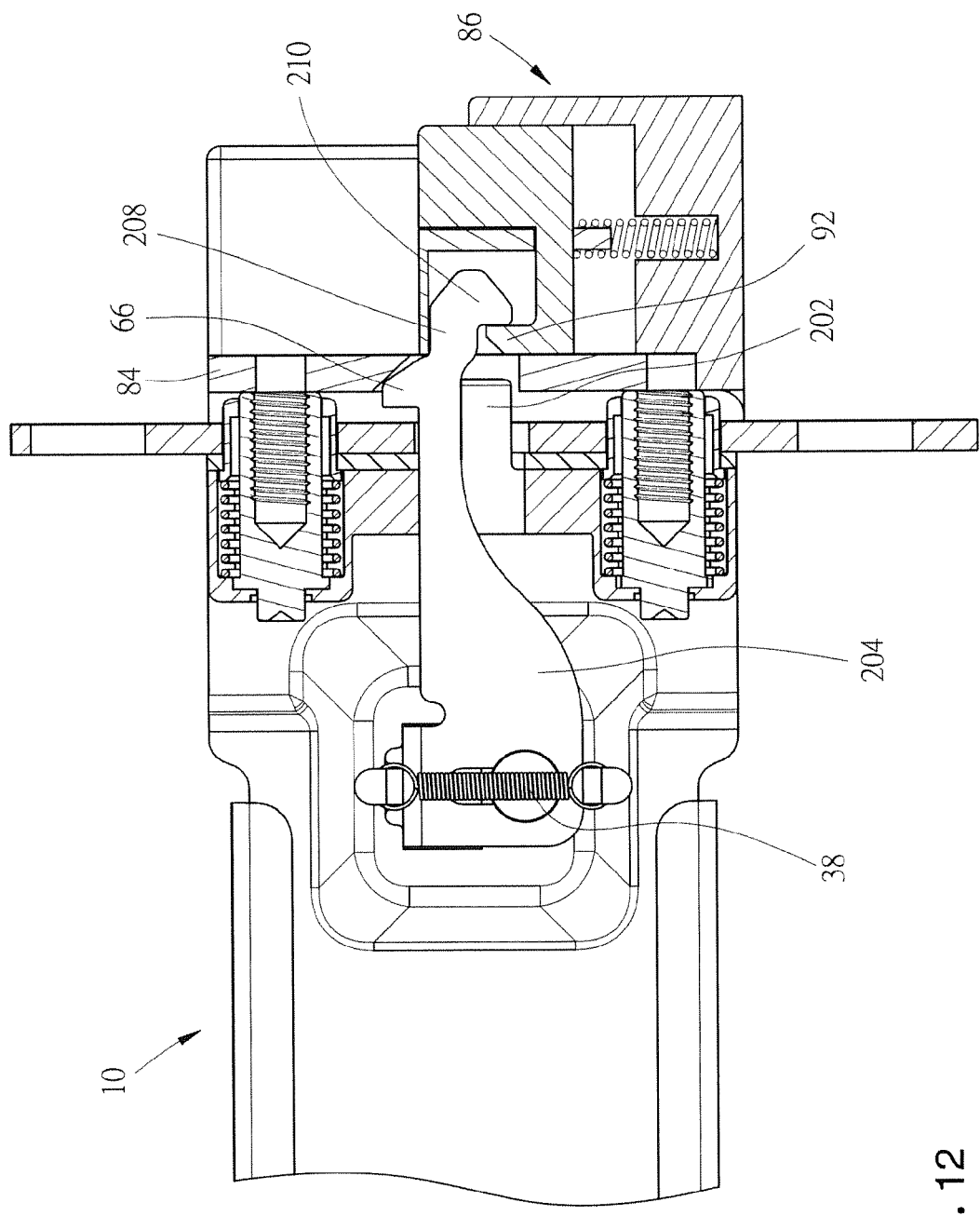
FIG. 12 shows the connection between the fixing device and the chassis of the embodiment in FIG. 10.

FIGS. 10 to 12 show another embodiment of the fixing device 200 which has an insertion member 202 and an engaging member 204, wherein the insertion member 202 is simply a body 206. The arm 208 of the engaging member 204 has a second protrusion 210 which is located corresponding to the second locking portion 92 of the locking device 86 of the chassis 84. When the chassis 84 is installed to the rack 78 by the two slide assemblies 10, the second locking portion 92 of the locking device 86 of the chassis 84 is engaged with the second protrusion 210 of the engaging member 204. Therefore, the embodiment omits the head 40 of the insertion member 32 and the first locking portion 44.

It is noted that the fixing device 12/200 comprises the insertion member 34/202, the engaging member 36/204, and the resilient member 38. Preferably, the fixing device 12 or 200 further has at least one installation member 52. The locking device 86 is not restricted to be used in the chassis 84 only.

While we have shown and described the embodiment in accordance with the present invention, it should be clear to those skilled in the art that further embodiments may be made without departing from the scope of the present invention. For example, when one of the first and second guide portions 68, 70 is a hole, the types of said hole can be a through hole or a blind hole; and when the other one of the first and second guide portions 68, 70 is a guiding slot, said slot can be equivalently configured as a groove or a recess without departing the scope that the arrangement, among the first and second guide portions 68, 70 and guide member 72, makes the engaging member 36/204 slidably connected relative to the bracket 18.

What is claimed is:

1. A slide assembly comprising:
   a support member and a bracket connected to the support member, the bracket having a side wall and an end wall, the side wall having a window, the end wall substantially perpendicularly connected to the side wall;
   at least one installation member connected to the end wall of the bracket;
   an insertion member connected to the end wall of the bracket and having a slot defined therein, the end wall having a through hole and the insertion member extending through the through hole;
   an engaging member slidably connected relative to the bracket and having an operation portion and an arm, the operation portion located corresponding to the window of the side wall of the bracket, the arm extending through the slot of the insertion member and having a first protrusion; and
   a resilient member providing a force to the engaging member to extend the first protrusion beyond the slot of the insertion member.

2. The slide assembly as claimed in claim 1, wherein the insertion member has a body and a head connected with the body, the body of the insertion member has a recessed area and a first locking portion which is located in the recessed area and adjacent to the head.

3. The slide assembly as claimed in claim 1, wherein the end wall has two installation holes, a fixing member and two installation members are connected to the fixing member, the fixing member is fixed to the bracket, and the installation members extend through the installation holes of the end wall of the bracket respectively.

4. The slide assembly as claimed in claim 3, wherein each installation member has a movable rectangular portion, a cylindrical portion and a spring, the rectangular portion is slidably connected relative to the cylindrical portion, the spring applies a force to the rectangular portion so that the rectangular portion extends beyond the fixing member and located at a pre-set position.

5. The slide assembly as claimed in claim 4, wherein the operation portion of the engaging member slidably contacts an inside of the window, so that the engaging member is movable relative to the insertion member to control the first protrusion of the arm to protrude beyond or to retract toward the slot of the insertion member.

6. The slide assembly as claimed in claim 5, wherein the side wall of the bracket has a first guide portion, the engaging member has a second guide portion, a guide member is located between the first and second guide portions.

7. A fixing device comprising:
a bracket, the bracket having a side wall and an end wall, the end wall is substantially perpendicularly connected to the side wall;
at least one installation member connected to the bracket;
an insertion member connected to the bracket and having a slot;
an engaging member slidably connected relative to the bracket and having an arm which extends through the slot of the insertion member, the arm having a first protrusion, the engaging member having an operation portion located in correspondence to the side wall of the bracket, the side wall having a window, the operation portion of the engaging member slidably contacts an inside of the window, so that the engaging member is movable relative to the insertion member to control the first protrusion of the arm to protrude beyond or to retract toward the slot of the insertion member; and
a resilient member providing a force to the engaging member to extend the first protrusion beyond the slot of the insertion member.

8. The fixing device as claimed in claim 7, wherein the end wall has a through hole, and the insertion member extends through the through hole.

9. The fixing device as claimed in claim 8, wherein the insertion member has a body and a head connected with the body, the body of the insertion member has a recessed area and a first locking portion which is located in the recessed area and adjacent to the head.

10. The fixing device as claimed in claim 7, wherein the end wall has two installation holes, a fixing member and two installation members which are connected to the fixing member, the fixing member is fixed to the bracket, and the installation members extend through the installation holes of the end wall of the bracket respectively.

11. The fixing device as claimed in claim 10, wherein each installation member has a movable rectangular portion, a cylindrical portion and a spring, the rectangular portion is slidably connected relative to the cylindrical portion, the spring applies a force to the rectangular portion so that the rectangular portion extends beyond the fixing member and located at a pre-set position.

12. The fixing device as claimed in claim 7, wherein the bracket has a first guide portion, the engaging member has a second guide portion, a guide member is located between the first and second guide portions.

13. The fixing device as claimed in claim 9, wherein the first locking portion of the insertion member is locked to a locking device of a chassis.

14. The fixing device as claimed in claim 7, wherein the engaging member has a second protrusion which is locked to a locking device of a chassis.

15. A slide assembly for being installed to a rack which has multiple columns, each column having multiple holes which comprises a first hole, a second hole and a third hole located between the first and second holes, a chassis connected to the rack by two slide assemblies, the chassis has a locking device, each slide assembly comprising:
a first rail;
a second rail being slidable relative to the first rail;
a bracket connected to the first rail, the bracket having a side wall and an end wall, the side wall having a window, the end wall substantially perpendicularly connected to the side wall, the end wall having two installation holes and a through hole;
a fixing member fixed to the bracket;
a third rail slidably connected between the first and second rails;
an insertion member connected to the end wall of the bracket and partially extending through the through hole of the end wall of the bracket, the insertion member having a slot and a locking portion which is located corresponding to the locking device of the chassis;
an engaging member slidably connected relative to the bracket, the engaging member having an operation portion and an arm, the operation portion located corresponding to the window of the side wall of the bracket, the arm extending through the slot of the insertion member and having a first protrusion;
a resilient member providing a force to the engaging member to extend the first protrusion beyond the slot of the insertion member;
two installation members connected to the fixing member and extending through the installation holes of the end wall of the bracket respectively; and
the two installation members installed through the first and second holes of the column of the rack respectively, the insertion member inserted into the third hole of the column of the rack, the arm of the engaging member extending through the slot of the insertion member, the first protrusion of the engaging member extending beyond the slot of the insertion member and engaged with the column of the rack by the force of the resilient member applied to the engaging member, when the slide assembly is installed to the rack, the first locking portion of the insertion member is engaged with the locking device of the chassis.

16. The slide assembly as claimed in claim 15, wherein the operation portion of the engaging member slidably contacts an inside of the window, the engaging member is movable relative to the insertion member to control the first protrusion of the arm to protrude beyond or to retract toward the slot of the insertion member.

17. The slide assembly as claimed in claim 15, wherein the side wall of the bracket has a first guide portion, the engaging member has a second guide portion, a guide member is located between the first and second guide portions.

* * * * *